HIGH INPUT IMPEDANCE RELAY CONTROL CIRCUIT
Filed June 6, 1962
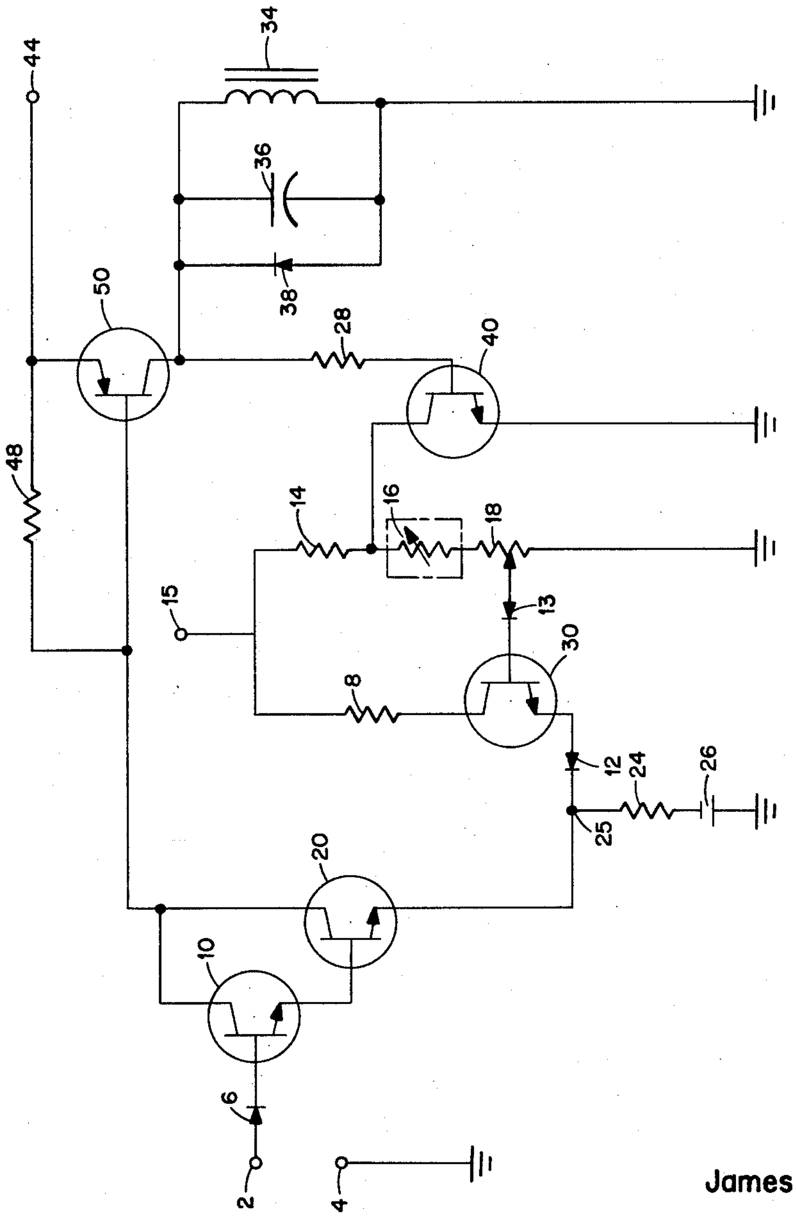
James A. Power,
*INVENTOR.*
BY A. J. Rotondi
A. T. Dupont
D. H. Ward United States Patent Office 3,133,232
Patented May 12, 1964

3,133,232

HIGH INPUT IMPEDANCE RELAY CONTROL CIRCUIT

James A. Power, Huntsville, Ala., assignor to the United States of America as represented by the Secretary of the Army Filed June 6, 1962, Ser. No. 200,591
5 Claims. (Cl. 317—148.5)
(Granted under Title 35, U.S. Code (1952), sec. 266)

The invention described herein may be manufactured and used by or for the Government for governmental purposes without the payment of any royalty thereon.

This invention relates to a D.C. relay control circuit and more particularly to a transistorized, high input impedance circuit for controlling a relay.

It has been found that in many applications where transistorized relay control circuits are used that a need exists for providing a circuit having a high input impedance with positive feed-back without using a special input pre-amplifier. It has also been found that a need exits for providing relay control circuits having stable D.C. amplifiers. This has been due to serious variations of transistor parameters with temperature and also due to drifts in input voltage.

It is therefore one object of this invention to provide a D.C. circuit for controlling a relay having a high input impedance as well as a high gain.

Another object of this invention is to provide a circuit for controlling a relay having good stability.

It is also an object of this invention to provide a circuit for controlling a relay which utilizes a form of positive feedback without sacrificing a loss of input impedance and thereby provides fast switching time.

According to the present invention the foregoing and other objects are attained by providing a relay control circuit which includes an input amplifier stage characterized by high gain and high input impedance. One side of the amplifier stage is connected to a switching stage for controlling the relay and the switching stage in turn is connected back to the other side of the input amplifier stage through a positive feedback stage.

The invention will be more fully understood through the following detailed description taken in conjunction with the accompanying drawing wherein the figure is a schematic circuit diagram showing a preferred embodiment of the invention.

Referring to the figure an input signal is applied at terminals 2 and 4. A diode 6 is used to protect a transistor 10 from excessive breakdown voltage due to large negative potentials at the input terminals or large voltage transients from a positive source of potential 44. Transistor 10 as well as transistors 20, 30 and 40 are of the N-P-N type. Each of these transistor units includes the usual base, emitter and collector electrodes. Transistors 10 and 20 are connected in cascade to achieve high input impedance with high gain and form one side of a differential amplifier input stage. The emitter of transistor 10 is directly connected to the base of transistor 20 while the collectors of transistors 10 and 20 are connected to the base of a transistor switching stage 50 and also through a common load resistor 48 to positive source of potential 44.

The emitter of transistor 20 is connected through a resistor 24 to a source of bias 26. The other side of the differential amplifier includes a transistor 30 and its associated circuitry. The emitter of transistor 30 is connected through a temperature compensating diode 12 to the emitter of transistor 20. The base of transistor 30 is connected through another temperature compensating diode 13 which is the same as diode 12 and connected to a point on a variable resistance 18. One end of resistance 18 is grounded while the other end is connected to one side of a thermistor 16. Thermistor 16 is quite sensitive to temperature changes and has a rather high negative temperature coefficient.

The other side of thermistor 16 is connected through a resistor 14 to a second positive source of potential 15. This source of potential is preferably a regulated source in order to eliminate changes in the voltage level at a switching point 25 due to variations of an unregulated voltage source. The collector of transistor 30 is connected through resistor 8 to said potential source 15. Variable resistance 18 may be set at a particular value of resistance to provide a desired amount of collector current for transistor 30 and consequently to provide a particular value of voltage at point 25. Bias 26 is included to provide a negative voltage at point 25 so that transistor 50 may be switched at points close to zero volts input. If the desired switching point is positive by a few volts, reliable switching can be achieved and the bias source eliminated. Switching stage 50 is a directly-coupled P–N–P switching stage using a relay 34 as a collector load. A diode 36 is placed in parallel across the relay to prevent high voltage appearing across the relay coil during the turning-off period of switching stage 50. A capacitor 38 is also connected in parallel across the relay to prevent chatter and shunt noise. The collector of transistor 50 is connected through a current-limiting resistor 28 to the base of transistor 40 which is designed to provide positive switching action. The emitter of transistor 40 is connected directly to ground while the collector is connected between resistor 14 and thermistor 16.

In operation, the transistor 30 is in a normally conducting state and a negative voltage appears at point 25. For purposes of illustration it will be assumed that a negative one volt appears at point 25 while transistor 30 is conducting. When a D.C. input signal applied at terminals 2 and 4 reaches zero volts, transistors 10 and 20 will start to slowly conduct (i.e., they do not turn "full on") and consequently a negative bias is placed on the base of transistor 50. The negative bias placed on the base of transistor 50, which is of the P–N–P type, will cause this transistor to start conducting. Since the base of transistor 40 is directly coupled to relay coil 34 through current-limiting resistor 28, the slowly conducting transistor 50 will allow the base of transistor 40 to draw base current and start conducting. The reason transistor 40 draws base current is due to the increasing voltage across relay coil 34 as transistor 50 starts to conduct. The conduction of transistor 40 will then slow the conduction of transistor 30 and a greater value of bias at point 25 (—2 volts in this illustration) will be applied to "turning-on" transistors 10 and 20 so that they are now conducting "full-on." The "turning-on" of transistors 10 and 20 causes transistor 50 to saturate. When transistor 50 becomes saturated the increased current through relay coil 34 causes the relay to "turn on." At the same time transistor 40 will conduct heavily and accordingly transistor 30 will cut off. The relay will remain on until the input signal drops below zero volts, at which time transistors 10 and 20 will cut off and consequently transistor 50 will also cut off. During the switching-off action as the voltage across the coil is reduced, the base drive to transistor 40 is reduced allowing transistor 30 to start conducting again. This reduces the bias voltage at point 25 to a negative one volt and aids in the "turning-off" process.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

The following invention is claimed:

1. A high input impedance D.C. relay control circuit comprising:

(a) an input stage having a differential amplifier circuit;

(b) said amplifier circuit including a first and second transistor connected in cascade for providing high input impedance with high gain and a third transistor having temperature compensation means connected thereto for providing good stability to said relay control circuit;

(c) means for providing a reference potential for said relay control circuit;

(d) signal input means coupled between said first transistor and said reference potential;

(e) a switching stage including a fourth transistor connected to said first and second transistor;

(f) a relay actuated by said switching stage and forming a collector load of said fourth transistor; and (g) feedback means connected between the switching stage and said third transistor to provide a form of positive feedback without sacrificing a loss of high input impedance.

2. A relay control circuit as set forth in claim 1 wherein:

(a) said first, second and fourth tranistor each have a base, a collector and an emitter, and are disposed so that the emitter of said first transistor is connected to the base of said second transistor and the collectors of said first and second transistors are connected to the base of said fourth transistor;

(b) an input terminal connected through a diode to the base of said first transistor; and (c) said diode allowing the first transistor to sense a high positive voltage.

3. A relay control circuit as set forth in claim 2 wherein:

(a) said feedback means includes a fifth transistor having a base, a collector, and an emitter; and (b) a source of potential positive with respect to said reference potential connected through a first load resistor to the collector of said fifth transistor.

4. A relay control circuit as set forth in claim 3 wherein:

(a) a second source of potential positive with respect to said reference potential is connected to the emitter of said fourth transistor;

(b) said second source of potential being connected through a second load resistor to the collectors of said first and second transistors;

(c) said relay is connected between the collector of said fourth transistor and said reference potential; and (d) a second diode and a capacitor are connected in parallel across said relay.

5. A high input impedance D.C. relay control circuit comprising:

(a) an input amplifier stage including a first, second and third transistor each having a base, a collector and an emitter;

(b) a diode connected to the base of said first transistor;

(c) means providing a reference potential for said circuit;

(d) signal input means coupled between said diode and said reference potential;

(e) the emitter of said first transistor being connected to the base of said second transistor, and the emiter of said second transistor being connected to a reference point, said reference point being connected through a resistor to a potential point negative with respect to said reference potential and said reference point also being connected through a first temperature sensitive means to the emitter of said third transistor;

(f) a switching stage including a fourth transistor having a base, a collector and an emitter;

(g) the collectors of said first and second transistors being connected to the base of said fourth transistor;

(h) the emitter of said fourth transistor being connected to a first potential point positive with respect to said reference potential;

(i) said first potential point connected through a first load resistor to the collectors of said first and second transistors;

(j) a positive feedback stage including a fifth transistor having a base, a collector, and an emitter;

(k) the base of said fifth transitor being connected through a current limiting resistor to the collector of said fourth transistor;

(l) the emitter of said fifth transistor being connected to said point of reference potential;

(m) the collector of said fifth transistor being connected through a second temperature sensitive means and a variable resistor to the base of said third transistor; and (n) the collectors of said third and fifth transistors being connected through a second and third load resistor respectively to a second point of potential positive with respect to said reference potential.

References Cited in the file of this patent

UNITED STATES PATENTS

| | | |
|---|---|---|
| 2,995,712 | Montgomery | Aug. 8, 1961 |
| 3,059,177 | Winchel | Oct. 16, 1962 |
| 3,077,551 | Nelson et al. | Feb. 12, 1963 |

OTHER REFERENCES

Bohr "Sensitive Relay Circuits," Radio Electronics, Jan. 1958, pages 112, 114, 115.